United States Patent [19]
Bagchi et al.

[11] Patent Number: 5,694,444
[45] Date of Patent: Dec. 2, 1997

[54] TESTABLE HIGH COUNT COUNTER

[75] Inventors: Sonali Bagchi, Allentown; Jalil Fadavi-Ardekani, Orefield; Kenneth Daniel Fitch, Allentown, all of Pa.; Daisuke Takise, San Jose, Calif.

[73] Assignee: Lucent Technologies Inc., Murray Hill, N.J.

[21] Appl. No.: 703,614

[22] Filed: Aug. 27, 1996

[51] Int. Cl.$^6$ .................................................. G11C 19/00
[52] U.S. Cl. .................... 377/54; 377/20; 377/75
[58] Field of Search .................... 377/20, 54, 75

[56] References Cited

U.S. PATENT DOCUMENTS 5,542,051  7/1996  Farrell et al. ........................ 327/142

*Primary Examiner*—Margaret Rose Wambach
*Attorney, Agent, or Firm*—James H. Fox

[57] ABSTRACT

An integrated circuit counter is capable of implementing a relatively high count while being testable using a relatively low number of clock cycles. A linear-feedback shift register (LFSR) having n bit positions is used as the counter. The feedback path of the shift register includes an exclusive OR (XOR) gate that couples selected bits back to the input of the register, in order to implement a $2^n-1$ counter. Combinatorial logic circuitry is included to test the counter in significantly less than $2^n-1$ clock cycles. This allows for implementing a testable "watchdog timer" that may be used to detect software runaway conditions in microprocessor systems, among other uses.

12 Claims, 3 Drawing Sheets

TESTABLE HIGH COUNT COUNTER

BACKGROUND OF THE INVENTION

1. Field of the Invention

The present invention relates to a counter that is testable.

2. Description of the Prior Art

Various microprocessor-controlled computer systems utilize watchdog timers to detect software runaway situations. Such timers are typically implemented as counters implemented with Boolean logic gates (AND, OR, etc), or linear feedback shift registers (LFSRs). The counters are loaded with a specified value, and start counting down from this value. Under normal system operation, a software command causes the watchdog timer to reload the initial value at regular intervals. However, if the reload fails to occur within a given amount of time, as in the case of a runaway, the counter runs to zero and triggers a system-wide reset. With typical clock periods of about 30 nanoseconds, a counter will count about $2^{20}-1$ clock cycles in order to obtain a reset interval of 31 milliseconds. Therefore, a 20-bit counter may be required to obtain the desired reset interval, with other relatively large values being possible.

However, such large counters are difficult to test efficiently during manufacture of the integrated circuit that implements the counter. That is, a clock frequency used for testing that is comparable to the intended system clock frequency will require a time period to achieve a satisfactory test result that is comparable to the intended reset interval; e.g., 31 milliseconds in the illustrative case. Such times are typically too long for economical utilization of the relatively expensive testing apparatus used in integrated circuit production. Furthermore, it is usually not feasible to test at a clock frequency significantly higher than the intended operational frequency, since that would usually require a more advanced integrated circuit (IC) manufacturing technology or circuit design than is otherwise required.

SUMMARY OF THE INVENTION

We have invented an integrated circuit counter that is capable of implementing a relatively high count while being testable using a relatively low number of clock cycles. A linear-feedback shift register (LFSR) is used to implement the counter. The feedback path of the shift register includes an exclusive OR (XOR) gate that couples selected bits back to the input of the register. Combinatorial logic circuitry detects a bit pattern that occurs when all bits in the counter have made all possible state transitions in less than the maximum count.

DETAILED DESCRIPTION

The present detailed description relates to a counter that may be used to obtain a high count while being testable with a relatively low number of clock cycles. An illustrative embodiment of the invention is described below for a watchdog timer ("WDT") application. However, the inventive technique may be used for a variety of other applications where a high count in a testable counter is desired. Since a watchdog timer should be capable of counting time intervals which are relatively large as compared to the system clock period, a 20-bit linear-feedback shift register is used to prescale the clock in the illustrative embodiment discussed herein. However, other size registers are alternately possible as discussed below.

Figure 1:
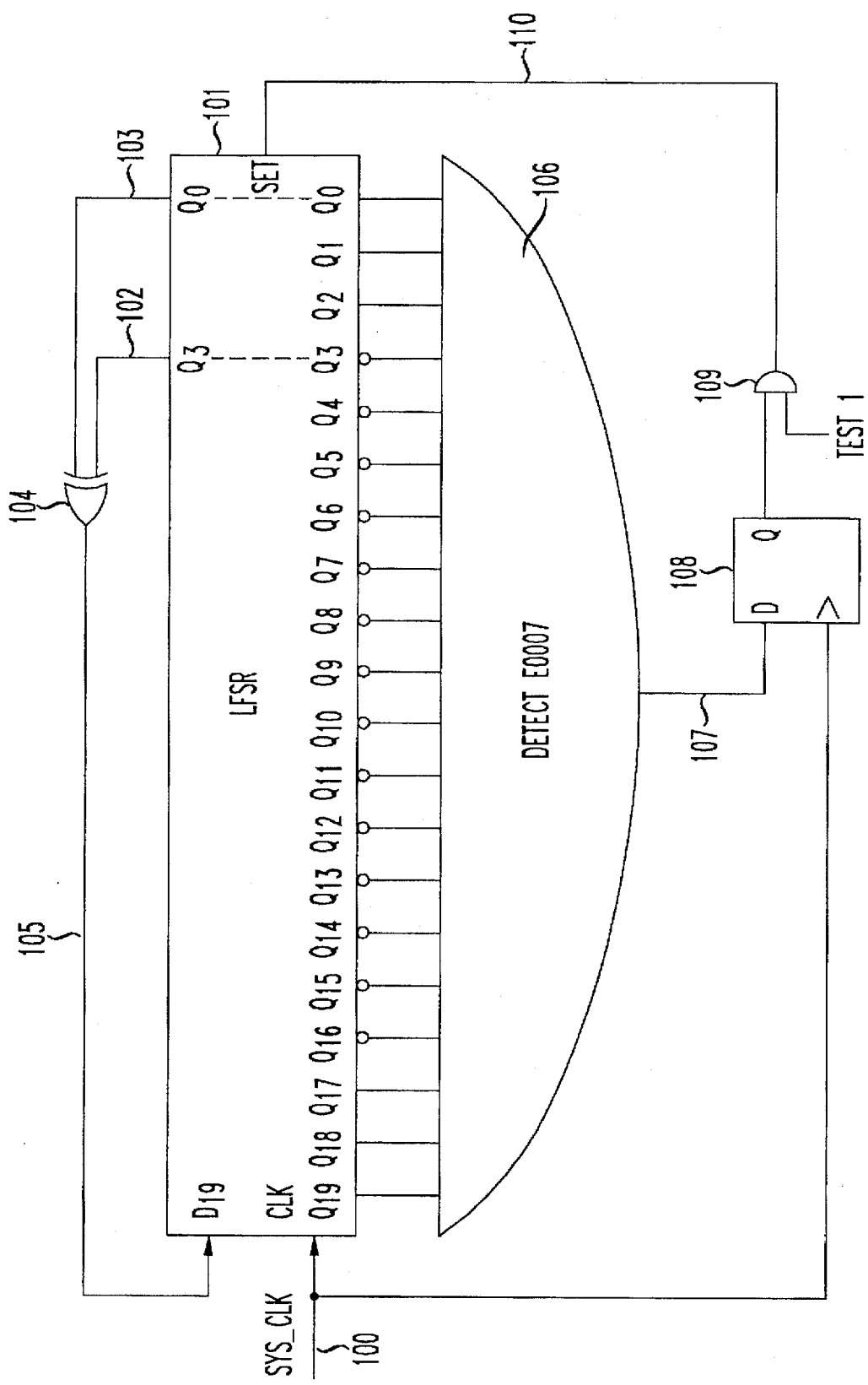
FIG. 1 shows an illustrative embodiment of the invention.

An efficient implementation is obtained in the illustrative embodiment by using a single exclusive OR gate which feeds the XOR of bits 0 and 3 back to the input of the register. The polynomial $X^{20}+X^3+1$ is known to be a primitive polynomial in the mathematics art. Since $X^{20}+X^3+1$ is a primitive polynomial in a Galois field of two elements, GF(2), if the register is set to all ones initially, it passes through all the $(2^{20}-1)$ non-zero states before coming back to the initial state. Referring to FIG. 1, an illustrative circuit embodiment of the inventive technique is illustrated. The linear feedback shift-register 101 has 20 bit positions, designated $Q_{19} \ldots Q_0$, a clock input CLK connected to SYS_CLK line 100, and a data input $D_{19}$ connected to line 105. A given data bit that is input to $D_{19}$ is initially placed in bit $Q_{19}$, and subsequently shifted down one bit position per clock cycle until it reaches $Q_0$, and is then eliminated from the LFSR 101 on the next clock cycle. However, a feedback path exists from bit positions $Q_3$ and $Q_0$ via exclusive OR (XOR) gate 104, the output of which feeds the data input $D_{19}$ via line 105. In this manner, the above-noted polynomial is implemented in a manner known in the art.

Surprisingly, we have found that this counter can be tested in 37 clock cycles using a relatively small amount of hardware. This may be compared to $2^{20}$ clock cycles which are theoretically required to test a 20-bit counter. Hence, a large savings in testing time may be obtained with the inventive technique. To implement the test, the inventive technique makes use of combinatorial logic coupled to the various bit positions. In the embodiment of FIG. 1, the AND gate 106 has 20 inputs, each of which is coupled to receive the value of the corresponding bit position, or the complement (inverted) value thereof, as indicated. The AND gate output line 107 goes high when all the inputs go high, which occurs when the 20-bit word represented by E0007 (in hexadecimal notation) is present in the LFSR. This word occurs after 37 clock cycles (i.e., on the 38th clock cycle), when the LFSR is initially set to all "1's" due to activation of the SET input. This is sufficient for testing, because we have discovered that each bit of the LFSR makes the four possible state transitions (i.e., 0→0, 0→1, 1→0, 1→1), and the XOR inputs (on lines 102 and 103) take on the four possible combinations (i.e, 00, 01, 10, 11) in the 37 clock cycles. When the state E0007H is detected, the AND gate output line 107 goes high. This is used to reset the LFSR at the next rising edge of the clock SYS_CLK by placing a SET signal on line 110 when the "Test 1" input of AND gate 109 is enabled. As a result, the LFSR is reset to all "1's".

Note that due to the presence of the flip-flop 108, this SET signal on line 110 occurs one clock cycle later than when the AND gate output line 107 goes high. Therefore, in the illustrative case, the SET signal occurs after 38 clock cycles; that is, on the 39th clock cycle. The flip-flop 108 is typically included to help avoid glitches on line 110 when the state of the LFSR is changing, but is optional insofar as the present invention is concerned.

Figure 2:
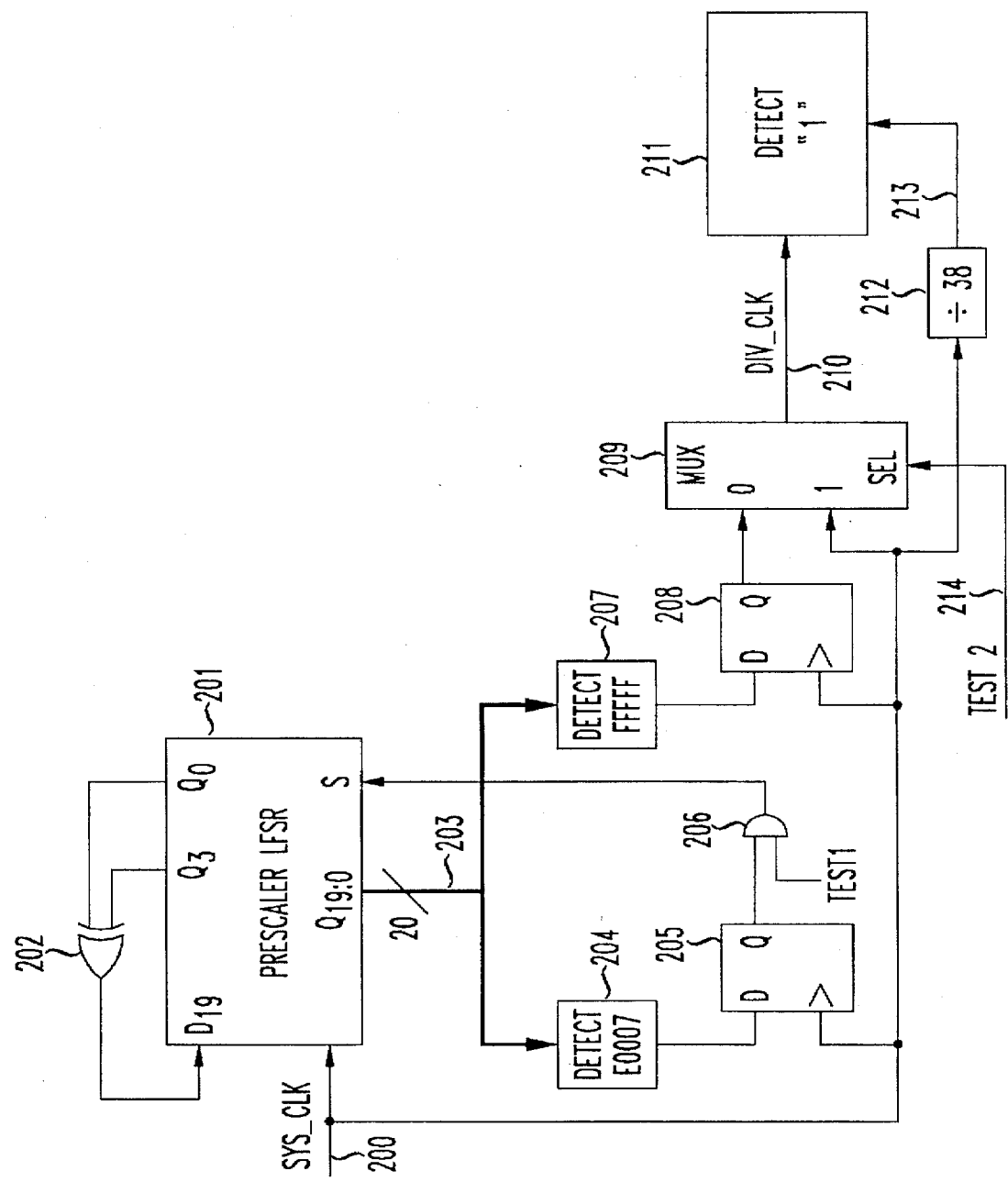
FIG. 2 shows further details of the illustrative embodiment.

Referring to FIG. 2, a further representation of the testing circuit embodiment is shown. The LFSR 201, XOR gate 202, DETECT E0007 circuit 204, D-Q flip-flop 205 and AND gate 206 correspond to those shown in FIG. 1. In addition, a DETECT FFFFF circuit 207 is included, being a 20-input AND gate that has no inverting inputs. The circuit 207 thereby detects the state of the LFSR wherein all the bits ($Q_{19:0}$) are "1". This occurs after $2^{20}-1$ clock cycles are received following each setting of the LFSR in normal operation, when the TEST1 input of AND gate 206 is low. However, all the bits are also "1" during testing of the LFSR (TEST1 high) when the LFSR is reset by the DETECT E0007 logic 204, D-Q flip-flop 205, and AND gate 206. By detecting whether all the bits are set to "1" following exactly 38 clock cycles, proper operation of the LFSR can be determined.

For this testing purpose, a divide by 38 counter 212, D-Q flip-flop 208 and multiplexer (MUX) 209 are also included. In testing operation, the MUX 209 selects the "0" input when testing of the LFSR is being performed. Therefore, when the LFSR again reaches the state of all "1's" in all bit positions, which occurs after 38 SYS_CLK cycles, the DETECT FFFFF circuit 207 places a "1" on the D input of flip-flop 208. This causes the Q output to go high on the next (i.e., 39th) clock, thereby placing a "1" on the output of MUX 209, being the DIV_CLK line 210. This "1" on line 210 is detected by a DETECT "1" circuit 211, which determines that the "1" is present on only the 39th clock cycle (and subsequent multiples of 38 clock cycles if desired), thereby indicating that the LFSR is functioning properly. The DETECT "1" circuit may be implemented by a down counter and zero detector, for example, when performing multiple tests of the LFSR. In addition, note that the MUX 209, under the control of the TEST2 signal online 214, may select the "1" input, whereby the SYS_CLK signal bypasses the LFSR, which may be used to facilitate the high-speed testing of other circuitry (not shown in FIG. 2), which uses DIV-CLK as the input clock.

Figure 3:
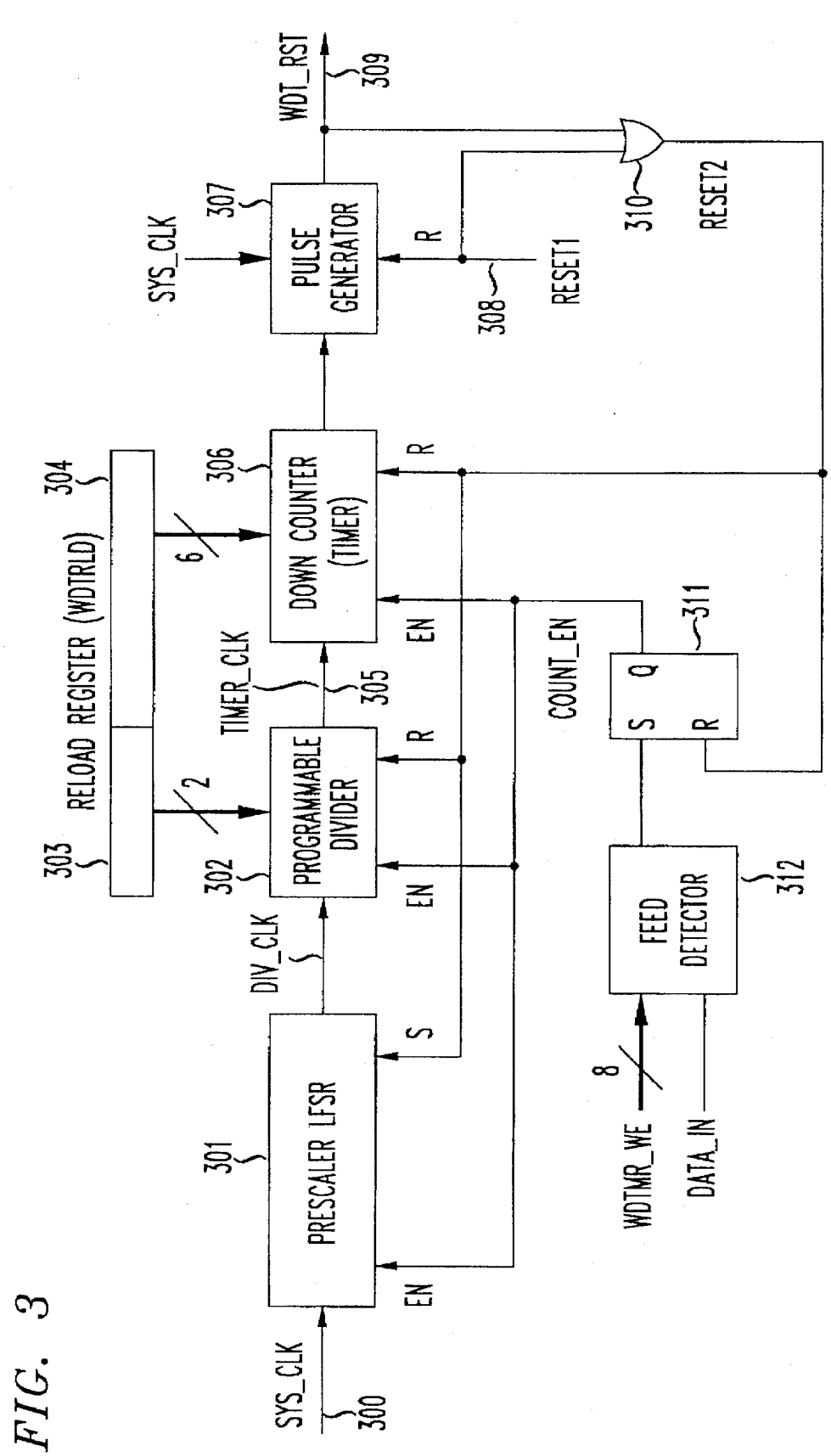
FIG. 3 shows an embodiment of a programmable watchdog timer that utilizes the present invention.

An illustrative embodiment of a watchdog timer that utilizes the inventive counter as a prescaler is shown in FIG. 3. Note that the various register values that are given for programming the circuitry are illustrative, and any desired values may be used, along with various other circuit implementations. The prescaler 301 receives the system clock input (SYS_CLK) on line 300, and outputs a divided clock (DIV_CLK) signal to the programmable timer 302. The programmable divider divides the clock further by 2, 4, 6 or 8 based upon bits [7:6] in the WDT reload register 303, when these bits are 00, 01, 10 and 11, respectively. The resulting output signal TIMER_CLK on line 305 is provided to a 6-bit down counter 306. When the count of this down counter reaches zero, a pulse generator 307 produces a pulse whose width equals N SYS_CLK cycles (e.g., N=4). This pulse is the WDT output on line 309, and is used to reset the system via OR gate 310. That is, RESET2 (the system reset) is equal to RESET1 OR WDT_RST, wherein RESET1 is the OR of the power-up reset (not shown) and the hardware reset (not shown). RESET2 is fed to the reset input of flip-flop 311. After a reset has occurred, the source of the reset can be determined by reading a status bit in a trap register ITC (not shown). In particular, bit ITC [5] is set when a WDT_RST occurs, and thus serves as a status flag.

The reload register WDTRLD is used to reload the programmable divider (via 2-bit portion 303) and the down counter (via 6-bit portion 304). The Watch-Dog Timer Master Register WDTMR (not shown) is used to feed the watchdog timer. The feed operation is accomplished by writing a specific value (E5H) into the WDTMR register. The watchdog timer detects the feed by checking the data on DATA_IN [7:0] of feed detector 312 when the write-enable signal WDTMR_WE for the WDTMR register is high. When a feed is detected, the clock dividers are enabled by flip-flop 311, the down counter is reloaded from the bits WDTRLD [5:0] and enabled to count down from this value. This technique of starting the watchdog timer makes inadvertent start-up of the counter very unlikely. Furthermore, in the event of a software runaway, the above-noted status bit may be included in the microprocessor to inform the user that the source of reset has been the watchdog timer. In case them is a reset (RESET2), the LFSR is initialized to ones, the programmable divider and down counter are initialized to zero, and counting disabled. The first feed following reset enables the watchdog timer. Once the WDT has been enabled, it cannot be disabled except by RESET1. Under normal condition, feed occurs at regular intervals so that the down counter can never reach the zero-state. In the absence of a feed, a system reset is triggered after a programmable WDT interval.

The test circuitry of FIGS. 1, 2 and 3 may be implemented on a given integrated circuit if desired, as when implementing built-in self-test (BIST) capability. However, various of the test functions shown may be implemented by external test circuitry if desired. For example, in lieu of an on-chip clock divider (212 in FIG. 2), the occurrence of the requisite number of clock cycles for performing the test (38 in the illustrative case) may be determined by monitoring the output patterns of the IC under test. While the illustrative case has shown a $2^{20}-1$ counter, the present technique may be implemented in general for a $2^n-1$ counter, where n is any positive integer. Then, testing of the counter may be accomplished with less than $2^n-1$ clock cycles by use of the inventive technique.

The above illustrative embodiment is only one possible utilization of the inventive technique. Numerous other applications may advantageously use a counter capable of achieving a high count value while still requiring relatively few clock cycles to test. While the illustrative embodiment has shown the counter implemented with a 2-input XOR gate, the use of XOR gates having 3 or more inputs are possible for implementing the inventive counter, in which case 3 or more bits may be feed back to the input. As is known in the art, an XOR gate in general produces a "0" output when an even number of "1's" are present on the inputs, and produces a "1" output when an odd number of "1's" are present on the inputs. The XOR gate may be implemented using a variety of circuit techniques that make use of various Boolean logic elements, including AND gates, OR gates, and their complements, as is well known in the art. Then, other primitive polynomials may be implemented in a testable LFSR by feeding back other bits to the data input via the multi-input XOR gate. Furthermore, the combinatorial logic circuitry may be implemented by a variety of circuit techniques known in the art.

We claim:

1. An integrated circuit comprising a shift register having n bit locations and having a data input for receiving a data signal, a set input for receiving a set signal, and a clock input for receiving a clock signal;

and further comprising feedback circuitry for feeding back a data signal to said data input when a given pattern of bits is located in said shift register;

characterized in that said integrated circuit further comprises first combinatorial logic circuitry having n inputs connected to said n bit locations, and having an output to indicate that a desired test pattern has been achieved when each bit of the shift register has made all possible state transitions in a number of clock cycles less than $2^n-1$;

and further characterized in that said integrated circuit further comprises second combinatorial logic circuitry having n inputs connected to said n bit locations, and having an output to indicate when a count of $2^n-1$ clock cycles has been achieved.

2. The invention of claim 1 wherein said feedback circuitry comprises an exclusive OR gate having a first input coupled to a first bit location and a second input coupled to a second bit location, and having an output coupled to said data input.

3. The invention of claim 2 wherein n=20 arranged from bit 19 nearest the data input to bit 0 farthest from the data input, and wherein bit 0 is said first bit location that is coupled to said first input of said exclusive OR gate, and bit 3 is said second bit location that is coupled to said second input of said exclusive OR gate.

4. The invention of claim 1 further comprising a flip-flop having a data input coupled to the output of said first combinatorial circuitry, having a clock input coupled to receive said clock signal, and an output coupled to said set input of said shift register.

5. A computer system having a watchdog timer for indicating the occurrence of a software runaway situation, said watchdog timer including a counter comprising:
  a shift register having n bit locations and having a data input for receiving a data signal, a set input for receiving a set signal, and a clock input for receiving a clock signal;
  and further comprising feedback circuitry for feeding back a data signal to said data input when a given pattern of bits is located in said shift register;
  characterized in that said watchdog timer further comprises first combinatorial logic circuitry having n inputs connected to said n bit locations, and having a test output to indicate that a desired test pattern has been achieved when each bit of the shift register has made all possible state transitions in a number of clock cycles less than $2^n-1$;
  and further characterized in that said watchdog timer further comprises second combinatorial logic circuitry having n inputs connected to said n bit locations, and having a reset output to indicate when a count of $2^n-1$ clock cycles has been achieved, with said reset output being coupled to reset circuitry.

6. The invention of claim 5 wherein said feedback circuitry comprises an exclusive OR gate having a first input coupled to a first bit location and a second input coupled to a second bit location, and having an output coupled to said data input.

7. The invention claim 6 wherein n=20 arranged from bit 19 nearest the data input to bit 0 farthest from the data input, and wherein bit 0 is said first bit location that is coupled to said first input of said exclusive OR gate, and bit 3 is said second bit location that is coupled to said second input of said exclusive OR gate.

8. The invention of claim 5 further comprising a flip-flop having a data input coupled to the output of said first combinatorial circuitry, having a clock input coupled to receive said clock signal, and an output coupled to said set input of said shift register.

9. A method for resetting a computer system upon the occurrence of a software runaway situation, comprising the step of counting a clock signal by means of a counter, characterized in that said counting is accomplished by steps comprising:
  shifting data into a shift register having n bit locations via a data input under the control of a clock signal received via a clock input;
  and feeding back a data signal to said data input when a given pattern of bits is located in said shift register, whereby a $2^n-1$ counter is implemented for resetting said computer system;
  and wherein said counter comprises test circuitry that logically combines the data in the n bit positions of the counter to form an output signal that indicates that a desired pattern has been achieved when each bit of the shift register has made all possible state transitions in a number of clock cycles less than $2^n-1$.

10. The invention of claim 9 whereby feeding back said data signal is accomplished by exclusively ORing a first input coupled to a first bit location and a second input coupled to a second bit location, and providing the resulting signal to said data input.

11. The invention of claim 10 wherein n=20 arranged from bit 19 nearest the data input to bit 0 farthest from the data input, and wherein bit 0 is said first bit location, and bit 3 is said second bit location.

12. The invention of claim 9 further comprising the step of programmably dividing said data signal from said shift register in order to implement said resetting of said computer system.

* * * * *